US009383732B2

(12) United States Patent
Griffiths et al.

(10) Patent No.: US 9,383,732 B2
(45) Date of Patent: Jul. 5, 2016

(54) METHOD AND SYSTEM FOR ADAPTIVELY CONTROLLING A LASER-BASED MATERIAL PROCESSING PROCESS AND METHOD AND SYSTEM FOR QUALIFYING SAME

(71) Applicant: ELECTRO SCIENTIFIC INDUSTRIES, INC., Portland, OR (US)

(72) Inventors: Joseph J. Griffiths, Winthrop, MA (US); Kurt Pelsue, Wayland, MA (US)

(73) Assignee: ELECTRO SCIENTIFIC INDUSTRIES, INC., Portland, OR (US)

( * ) Notice: Subject to any disclaimer, the term of this patent is extended or adjusted under 35 U.S.C. 154(b) by 420 days.

(21) Appl. No.: 14/093,790

(22) Filed: Dec. 2, 2013

(65) Prior Publication Data
US 2014/0094954 A1     Apr. 3, 2014

Related U.S. Application Data

(62) Division of application No. 11/606,484, filed on Nov. 30, 2006, now abandoned.

(60) Provisional application No. 60/810,964, filed on Jun. 5, 2006.

(51) Int. Cl.
*H01S 5/06*        (2006.01)
*B23K 26/36*     (2014.01)
(Continued)

(52) U.S. Cl.
CPC .............. *G05B 11/01* (2013.01); *B23K 26/032* (2013.01); *B23K 26/36* (2013.01); *G05B 15/02* (2013.01);
(Continued)

(58) Field of Classification Search
CPC .................................. H01S 5/06; B23K 26/36
USPC ..................... 700/166, 245, 258; 372/9, 25, 372/29.01–29.016; 219/121.62, 121.68
See application file for complete search history.

(56) References Cited

U.S. PATENT DOCUMENTS 3,631,713 A    1/1972   Marom et al.
4,727,234 A    2/1988   Oprysko et al.
(Continued)

OTHER PUBLICATIONS

Ready, John F., Editor in Chief, LIA Handbook of Laser Materials Processing, Laser Institute of America, Magnolia Publishing Inc., 2001, pp. 19, 153, 159 & 161.
(Continued)

*Primary Examiner* — Samuel M Heinrich
(74) *Attorney, Agent, or Firm* — Haynes Beffel & Wolfeld LLP (57) ABSTRACT

A method and system for adaptively controlling a laser-based material processing process are provided. The system includes sensing equipment to measure a process variable or condition of at least one of a laser-based material processing system and a workpiece processed by the material processing system and to provide a corresponding measurement signal. The control system also includes a signal processor for processing the measurement signal to obtain a processed signal which initiates, at least semi-automatically, an action associated with at least one of the material processing system and the workpiece. A method and system for at least semi-automatically qualifying a laser-based material processing system which delivers laser energy to locations on or adjacent a plurality of microstructures formed on a workpiece to at least partially process the microstructures are also provided.

27 Claims, 5 Drawing Sheets

(51) Int. Cl.
  *G05B 11/01* (2006.01)
  *B23K 26/03* (2006.01)
  *H01L 21/66* (2006.01)
  *H01L 23/525* (2006.01)
  *G05B 15/02* (2006.01)

(52) U.S. Cl.
  CPC ............ *H01L 22/24* (2013.01); *H01L 23/5258* (2013.01); *H01S 5/06* (2013.01); *H01L 2924/0002* (2013.01)

(56) References Cited

U.S. PATENT DOCUMENTS

| | | | |
|---|---|---|---|
| 5,006,694 A | | 4/1991 | Handke et al. |
| 5,286,313 A | * | 2/1994 | Schultz ............... G10K 15/046 148/508 |
| 5,517,420 A | | 5/1996 | Kinsman et al. |
| 5,555,495 A | | 9/1996 | Bell et al. |
| 5,601,738 A | | 2/1997 | Engelhardt et al. |
| 5,801,965 A | | 9/1998 | Takagi et al. |
| 6,281,471 B1 | | 8/2001 | Smart |
| 6,316,743 B1 | | 11/2001 | Nagahori et al. |
| 6,340,806 B1 | | 1/2002 | Smart et al. |
| 6,483,071 B1 | | 11/2002 | Hunter et al. |
| 6,495,791 B2 | | 12/2002 | Hunter et al. |
| 6,573,473 B2 | | 6/2003 | Hunter et al. |
| 6,639,177 B2 | | 10/2003 | Ehrmann et al. |
| 6,662,063 B2 | | 12/2003 | Hunter et al. |
| 6,703,582 B2 | | 3/2004 | Smart et al. |
| 6,727,458 B2 | | 4/2004 | Smart |
| 6,777,645 B2 | | 8/2004 | Ehrmann et al. |
| 6,804,438 B2 | | 10/2004 | Stack et al. |
| 6,951,995 B2 | | 10/2005 | Couch et al. |
| 6,972,268 B2 | | 12/2005 | Ehrmann et al. |
| 6,989,508 B2 | | 1/2006 | Ehrmann et al. |
| 7,015,418 B2 | | 3/2006 | Cahill et al. |
| 7,027,155 B2 | | 4/2006 | Cordingley et al. |
| 7,119,351 B2 | | 10/2006 | Woelki |
| 7,148,447 B2 | | 12/2006 | Ehrmann et al. |
| 7,176,407 B2 | | 2/2007 | Hunter et al. |
| 7,192,846 B2 | | 3/2007 | Cordingley et al. |
| 7,344,076 B2 | | 3/2008 | Kakui |
| 7,358,157 B2 | | 4/2008 | Gu et al. |
| 7,689,369 B2 | | 3/2010 | Watanabe et al. |
| 2002/0167581 A1 | | 11/2002 | Cordingley et al. |
| 2004/0031779 A1 | | 2/2004 | Cahill et al. |
| 2004/0060910 A1 | | 4/2004 | Schramm |
| 2004/0134896 A1 | | 7/2004 | Gu et al. |
| 2004/0144760 A1 | | 7/2004 | Cahill et al. |
| 2004/0152233 A1 | | 8/2004 | Nemets et al. |
| 2004/0188399 A1 | | 9/2004 | Smart |
| 2005/0199598 A1 | | 9/2005 | Hunter et al. |
| 2005/0233537 A1 | | 10/2005 | Couch et al. |
| 2005/0282299 A1 | | 12/2005 | Kim et al. |
| 2006/0000814 A1 | | 1/2006 | Gu et al. |
| 2006/0028655 A1 | | 2/2006 | Cordingley et al. |
| 2006/0086702 A1 | | 4/2006 | Smart |
| 2006/0108337 A1 | | 5/2006 | Gu et al. |
| 2006/0151704 A1 | | 7/2006 | Cordingley |
| 2006/0186096 A1 | | 8/2006 | Schramm |
| 2006/0189091 A1 | | 8/2006 | Gu |
| 2006/0191884 A1 | | 8/2006 | Johnson et al. |
| 2006/0192845 A1 | | 8/2006 | Cordingley et al. |
| 2006/0199354 A1 | | 9/2006 | Gu |
| 2006/0205121 A1 | | 9/2006 | Couch et al. |
| 2006/0207975 A1 | | 9/2006 | Ehrmann et al. |
| 2006/0216927 A1 | | 9/2006 | Cordingley et al. |
| 2006/0256181 A1 | | 11/2006 | Ehrmann et al. |
| 2007/0031993 A1 | | 2/2007 | Nemets et al. |
| 2007/0052791 A1 | | 3/2007 | Cordingley et al. |
| 2007/0075058 A1 | | 4/2007 | Ehrmann et al. |
| 2007/0096763 A1 | | 5/2007 | Ehrmann et al. |
| 2007/0117227 A1 | | 5/2007 | Gu |
| 2007/0173075 A1 | | 7/2007 | Lee et al. |
| 2007/0178714 A1 | | 8/2007 | Gu et al. |
| 2007/0199927 A1 | | 8/2007 | Gu et al. |
| 2007/0215575 A1 | | 9/2007 | Gu et al. |
| 2007/0215820 A1 | | 9/2007 | Cordingley et al. |
| 2008/0011852 A1 | | 1/2008 | Gu et al. |
| 2008/0035614 A1 | | 2/2008 | Smart |
| 2008/0067155 A1 | | 3/2008 | Gu |
| 2008/0073438 A1 | | 3/2008 | Gu et al. |
| 2008/0094640 A1 | | 4/2008 | Cordingley et al. |

OTHER PUBLICATIONS

International Search Report for PCT/US2007/069612 dated May 19, 2008.
Written Opinion for PCT/US2007/069612 dated May 19, 2008.
LIA Handbook of Laser Materials Processing, Link/Cutting Making, Ed. in Chief Ready, Laser Institute of America, 2001, Chapter 19, pp. 595-615.

* cited by examiner

METHOD AND SYSTEM FOR ADAPTIVELY CONTROLLING A LASER-BASED MATERIAL PROCESSING PROCESS AND METHOD AND SYSTEM FOR QUALIFYING SAME

CROSS-REFERENCE TO RELATED PATENTS AND PUBLISHED PATENT APPLICATIONS

This application is a divisional of U.S. patent application Ser. No. 11/606,484 filed Nov. 30, 2006 which claims the benefit of U.S. provisional patent application Ser. No. 60/810, 964 filed Jun. 5, 2006.

Except where indicated, the following patents and patent applications are assigned to the assignee of the present invention and are hereby incorporated by reference in their entirety herein: U.S. Pat. No. 6,972,268 (the '268 patent); U.S. Pat. No. 6,949,844 (the '844 patent); U.S. Pat. No. 6,911,622 (the '622 patent); U.S. Pat. No. 6,878,899 (the '899 patent); U.S. Pat. No. 6,727,458 (the '458 patent); U.S. Pat. No. 6,573,473 (the '473 patent); published PCT Application No. WO 2004/114192 (the '4192 publication); published U.S. Patent Publication No. 2005/0150880 (the '0880 publication); and U.S. Pat. No. 6,987,786 (the '786 patent).

BACKGROUND OF THE INVENTION

1. Field of the Invention

The present invention relates to a method and system for adaptively controlling a laser-based material processing process and method and system for qualifying same.

The present description generally relates to laser-based repair of semiconductive substrates and process control thereof.

2. Background Art

Laser-based repair machines improve yield of various semiconductor processes. Repair machines may also be interfaced with electrical or visual test equipment. Test equipment outputs are used to control the repair process.

For example, an early laser-based IC mask repair method and system is disclosed in U.S. Pat. No. 4,727,234 (the '234 patent).

Figure 1:
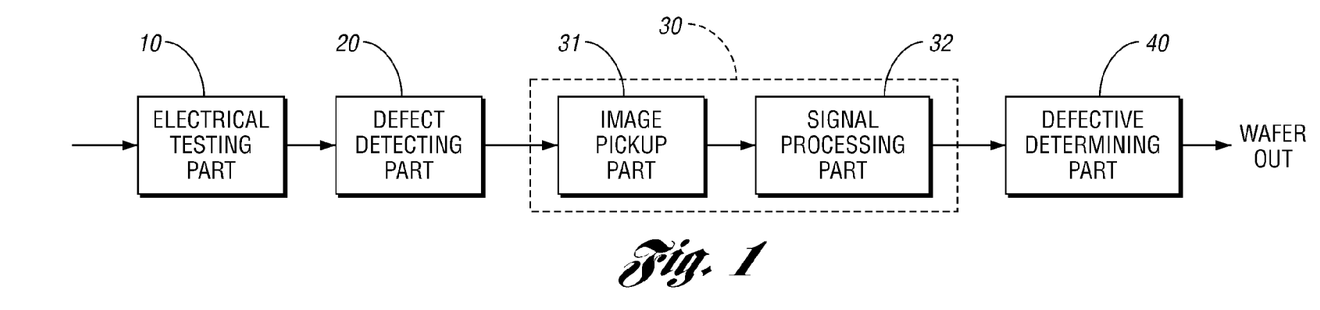
FIG. 1, incorporated from the '2299 publication, is a schematic block diagram of a wafer inspection system.

Published U.S. Patent Publication No. 2005/0282299 (the '2299 publication) entitled "Wafer Inspection System And Method Thereof" exemplifies increased "in-line" automation of a semiconductor fabrication process during a "pre-laser" process. Various defects are automatically detected and sorted using various algorithms. FIG. 1 herein (corresponding to FIG. 1 of the '2299 publication) is a block diagram of a wafer inspection system according to an embodiment of the '2299 publication. As shown, the system may comprise an electrical testing subsystem 10, a defect detecting subsystem 20, a defect sorting subsystem 30, and a defective determining subsystem 40. The electrical testing subsystem 10 can control a probe to be in contact with a pad of a die after loading a die-mounted wafer thereon, and can perform a predetermined electrical test process. Here, the electrical test process may include a burn-in process to test the durability of the die, a pre-laser process to supply an electrical current to the die to check a defective die according to an operation state, and a laser repair process to scan and repair the defective die with a laser, etc.

Memory repair is an example of a valuable manufacturing process used to improve the yield of memory chips. By way of example, general information on link blowing is available in LIA HANDBOOK OF LASER MATERIALS PROCESSING, Chapter 19, pp. 595-615, "Link/Cutting Making," Ed. in Chief Ready, Laser Institute of America, 2001. As indicated on page 595, individual links, identified by Automatic Test Equipment (ATE), are cut with a focused laser.

Japanese patent publication JP1083390 discloses a laser beam machine for cutting fuses and including a detector for measuring light reflected from a cut fuse.

U.S. Pat. No. 5,555,495 discloses adaptive control of a system with a human in the loop.

Prior repair systems include manual inspection. The information for inspection is typically obtained from a microscope system or SEM. The inspection equipment may include a computer and display. However, intermittent checks limit yield.

Therefore, present memory repair and other laser-based repair machines (1) rely upon the ATE to provide all defect information and (2) do not include closed loop control of the repair process.

SUMMARY OF THE INVENTION

There is a need for an improved laser-based repair system to increase yield of various semiconductor manufacturing processes.

It is desirable to eliminate unnecessary test steps in device fabrication.

At least some closed loop feedback control of a laser repair process is desirable to detect conditions and initiate appropriate actions.

In one aspect, a laser-based repair system to repair semiconductive substrates is disclosed. The system includes a processor and controller for at least semi-automatic control of the repair system based on a sensed condition.

In another aspect, a laser-based repair system is disclosed. The system includes laser processing equipment to repair at least a portion of a semiconductive workpiece with one or more focused laser pulses; at least one sensor responsive to a physical stimulus, the sensor response providing information representative of a condition of at least one of the laser-based repair equipment and the semiconductive workpiece; a processor to process the information, and a controller that initiates an action based on the information.

A process control method is disclosed for use in the laser-based repair system.

In carrying out one feature of the present invention, a method for adaptively controlling a laser-based material processing process is provided. The method includes automatically sensing a process variable or condition of at least one of a laser-based material processing system and a workpiece processed by the system and providing a corresponding measurement signal. The method also includes processing the measurement signal to obtain a processed signal which initiates, at least semi-automatically, an action associated with at least one of the system and the workpiece.

The method may be an adaptive control method for human operator-in-the-loop systems and the processed signal may semi-automatically initiate the action.

The workpiece may include a semiconductive substrate and the step of sensing may sense at least one defect of the substrate.

The step of sensing may be performed optically.

The action may be control of laser pulse energy delivered to a target structure on the workpiece.

The material processing system may deliver at least one focused laser pulse to the workpiece and the step of sensing may measure at least one of average laser power, peak pulse power, pulse width, spot diameter, spot shape, spot centering, focus and wavelength.

The action may direct or otherwise affect laser repair operations.

The step of sensing may include the step of imaging the workpiece at a plurality of different magnifications and the step of sensing may sense a condition of the workpiece at each of the plurality of different magnifications to provide corresponding measurement signals.

The material processing system may be a laser-based memory repair system. The workpiece may include links to be cut by the system and the step of sensing may include the step of obtaining images of the cut links at various locations and the step of processing may process the images to perform at least one of the following: verify that correct links were cut, determine cut quality and allow a human operator of the system to classify and quantify cut quality.

The step of sensing may be performed with an AOI subsystem to obtain image data and the method may further include the steps of receiving reference image data and comparing the reference image data with the image data obtained with the AOI subsystem to classify defects of the workpiece.

The action may be an automatic adjustment of at least one of a temporal characteristic and a spatial characteristic of a laser pulse generated by the material processing system.

The method may further include receiving a human operator-generated input and processing the input. The processed input and the measurement signal may be processed to obtain the processed signal to thereby semi-automatically initiate the action.

The method may still further include receiving a machine-generated input and processing the input. The processed input and the measurement signal may be processed to obtain the processed signal to thereby automatically initiate the action.

The step of processing may include the steps of processing the measurement signal to obtain data and inputting the data into a pattern recognition subsystem.

The pattern recognition subsystem may be a trainable neural network.

The step of sensing may include measuring laser-to-link alignment with a vision subsystem to detect a systematic alignment error or change in the alignment and the action may include halting laser material processing if the error or change exceeds a predetermined value.

The action may include execution of a diagnostic program to detect the source of the alignment error or change.

Still further in carrying out one feature of the present invention, a control system for adaptively controlling a laser-based material processing process is provided. The system includes sensing equipment to measure a process variable or condition of at least one of a laser-based material processing system and a workpiece processed by the material processing system and to provide a corresponding measurement signal. The control system also includes a signal processor for processing the measurement signal to obtain a processed signal which initiates, at least semi-automatically, an action associated with at least one of the material processing system and the workpiece.

The control system may be a human-in-the-loop system and the processed signal may semi-automatically initiate the action.

The workpiece may include a semiconductive substrate and the sensing equipment may sense at least one defect of the substrate.

The sensing equipment may include optical sensing equipment.

The action may be control of laser pulse energy delivered to a target structure on the workpiece.

The material processing system may deliver at least one focused laser pulse to the workpiece and the sensing equipment may measure at least one of average laser power, peak pulse power, pulse width, spot diameter, spot shape, spot centering, focus and wavelength.

The action may direct or otherwise affect laser repair operations.

The sensing equipment may include an imager for imaging the workpiece at a plurality of different magnifications and the sensing equipment may measure a condition of the workpiece at each of the plurality of different magnifications to provide corresponding measurement signals.

The material processing system may be a laser-based memory repair system. The workpiece may include links to be cut by the system and the sensing equipment may obtain images of the cut links at various locations and the signal processor may process the images to perform at least one of the following: verify that correct links were cut, determine cut quality and allow an operator of the repair system to classify and quantify cut quality.

The sensing equipment may include an AOI subsystem to obtain image data and the control system may further include a mechanism for receiving reference image data and a mechanism for comparing the reference image data with the image data obtained with the ACM subsystem to classify defects of the workpiece.

The action may be an automatic adjustment of at least one of a temporal characteristic and a spatial characteristic of a laser pulse generated by the material processing system.

The control system may further include a user interface for receiving a human operator-generated input and a processor for processing the input. The processed input and the measurement signal may be processed to obtain the processed signal to thereby semi-automatically initiate the action.

The control system may still further include a mechanism for receiving a machine-generated input and a processor for processing the input. The processed input and the measurement signal may be processed to obtain the processed signal to thereby automatically initiate the action.

The signal processor may process the measurement signal to obtain data and the control system may include a pattern recognition subsystem which receives the data.

The pattern recognition subsystem may be a trainable neural network.

The sensing equipment may include a vision subsystem for measuring laser-to-link alignment to detect a systematic alignment error or change in the alignment and the action may include halting laser material processing if the error or change exceeds a predetermined value.

The action may include execution of a diagnostic program to detect the source of the alignment error or change.

Still further in carrying out one feature of the present invention, a method for at least semi-automatically qualifying a laser-based material processing process is provided. The method includes using a laser-based material processing system to deliver laser energy to locations on or adjacent a plurality of microstructures formed on a workpiece to at least partially process the microstructures. The method further includes automatically sensing a process variable or condition of at least one of the system and the at least partially processed microstructures and areas of the workpiece adjacent the at least partially processed microstructures and providing corresponding measurement signals. The method also includes processing the measurement signals to obtain a processed signal which, at least semi-automatically, initiates qualification of the process.

The material processing system may include a laser-based link cutting system. The microstructures may include a plurality of links having a pitch and the processed signal may represent effective spot size of the laser energy at the locations.

The workpiece may be a test workpiece.

The step of sensing may be performed optically.

The step of sensing may be performed with an AOI subsystem to obtain image data.

The laser energy may be delivered in the form of laser pulses and the processed signal may initiate, at least semi-automatically, adjusting at least one of temporal and spacial characteristic of the laser pulses.

The laser energy may be delivered in the form of focused laser pulses and the processed signal may initiate, at least semi-automatically, adjusting at least one of average laser power, peak pulse power, pulse width, spot-diameter, spot shape, spot centering, focus and wavelength.

The method may further include receiving a human operator-generated input and processing the input. The processed input and the measurement signals may be processed to obtain the processed signal to thereby semi-automatically initiate qualification of the process.

The method may further include receiving a machine-generated input and processing the input. The processed input and the measurement signals may be processed to obtain the processed signal to thereby automatically initiate qualification of the process.

The method may be an adaptive qualifying method for a human operator-in-the-loop system and the processed signal may semi-automatically initiate qualification of the process.

Yet still further in carrying out one feature of the present invention. a system for at least semi-automatically qualifying a laser-based material processing system which delivers laser energy to locations on or adjacent a plurality of microstructures formed on a workpiece to at least partially process the microstructures is provided. The qualifying system includes sensing equipment to measure a process variable or condition of at least one of the material processing system and the at least partially processed microstructures and areas of the workpiece adjacent the at least partially processed microstructures and to provide corresponding measurement signals. The system also includes a signal processor for processing the measurement signals to obtain a processed signal which qualifies, at least semi-automatically, the material processing system.

The material processing system may include a laser-based link cutting system and the microstructures may include a plurality of links having a pitch.

The workpiece may be a test workpiece.

The sensing equipment may include optical sensing equipment.

The sensing equipment may include an AOI subsystem to obtain image data.

The laser energy may be delivered in the form of laser pulses and the processed signal may initiate, at least semi-automatically, adjusting at least one of temporal and spacial characteristic of the laser pulses.

The laser energy may be delivered in the form of focused laser pulses and the processed signal may initiate, at least semi-automatically, adjusting at least one of average laser power, peak pulse power, pulse width, spot-diameter, spot shape, spot centering, focus and wavelength.

The qualifying system may further include a user interface for receiving a human operator-generated input, and a processor for processing the input. The processed input and the measurement signals may be processed to obtain the processed signal to thereby semi-automatically initiate qualification of the material processing system.

The qualifying system may further include a mechanism for receiving a machine-generated input, and a processor for processing the input. The processed input and the measurement signals may be processed to obtain the processed signal to thereby automatically initiate qualification of the material processing system.

The qualifying system may be a human operator-in-the-loop system and the processed signal may semi-automatically initiate qualification of the material processing system.

The above features and advantages are readily apparent from the following detailed description of the best mode when taken in connection with the accompanying drawings.

DETAILED DESCRIPTION OF THE PREFERRED EMBODIMENT(S)

Unless otherwise stated the phrase "semiconductive workpiece" or terms "workpiece" or "substrate" are to be non-limiting, and are to be construed as a workpiece having a semiconductor material. By way of example, a workpiece may be a semiconductor wafer with a plurality of die thereon, and may generally include multi-material devices. Memory circuits fabricated on silicon substrates are one example, and are generally constructed as a series of layers on a silicon wafer as taught in LIA HANDBOOK (referenced above), U.S. Pat. Nos. 5,936,296; 6,320,243; and 6,518,140, and numerous other patents and publications. The workpiece may be an entire substrate (e.g., 200 mm diameter wafer) with a large number of die, singulated die or devices, device portions, or other variations of semiconductor devices or chips which may repaired with a laser.

Figure 2:
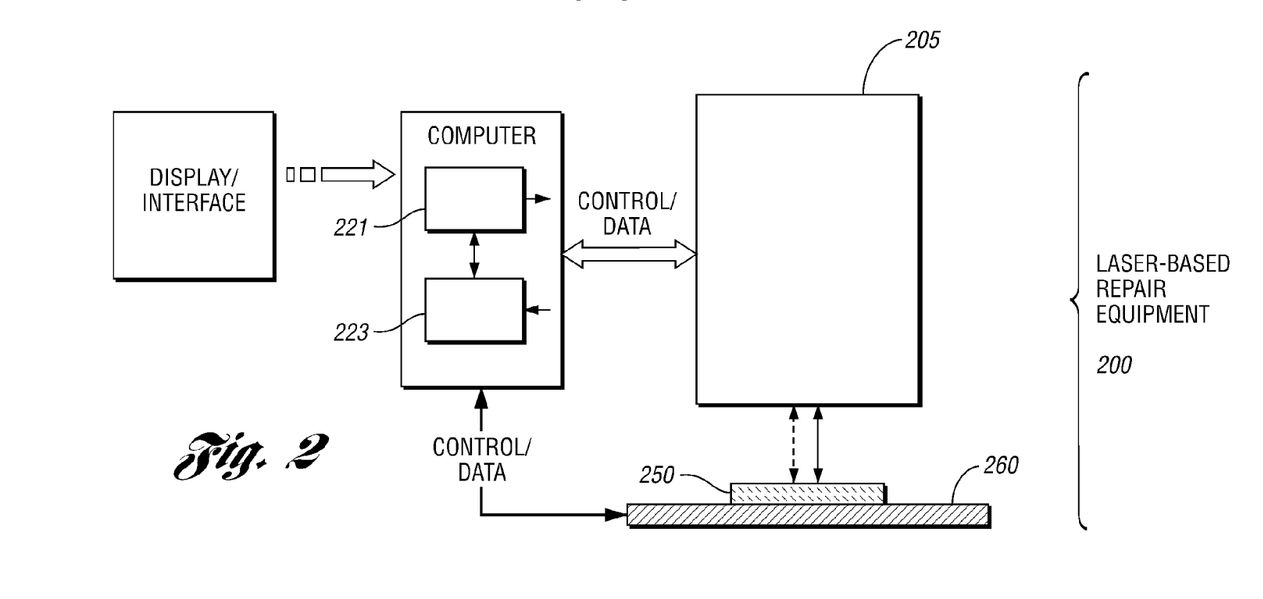
FIG. 2 is a schematic block diagram which shows one general embodiment of the present invention.

FIG. 2 shows some elements of a general embodiment of the present invention. The laser-based repair system 200 generally includes laser processing equipment, sensing equipment, a data or signal processor 223, a controller 221, and a user interface. By way of example, the laser-based repair equipment may be commercially available mask, memory, or other repair systems, or a sub-system thereof. In some embodiments the repair system will include a multi-axis substrate positioning equipment 260 and/or other equipment to position a workpiece 250 relative to a laser beam, or relative to other components of the repair system.

One or more sensors of the example embodiment in FIG. 2 is contained within a beam box 205, for example photodetectors, imaging arrays, thermal detectors etc. Other sensing equipment may also be disposed external to the beam box 205. For example, position/velocity sensors may provide information related to a condition or process variable of the workpiece positioner 260. Control signals may be provided to the workpiece positioner 260 from the controller 221.

The sensing equipment may include multiple sensors and associated information channels operatively connected to the process controller. Sensing devices detect various stimuli—for example: heat, radiant energy including light or other electro-magnetic radiation, electron emissions, electromagnetic fields, pressure, or motion. An arbitrary number of sensors may be used to monitor the laser-repair machine, workpiece conditions during the laser repair process, and/or for incoming workpiece defect detection (which may supplement or replace other ATE).

The processor 223 provides for at least semi-automatic processing of information and/or signals obtained from sensing equipment.

The controller 221 may generate control signals based on a detected condition. The control signals may direct or otherwise affect laser repair operations: for instance halting repair, causing execution of at least one of a calibration, diagnostic and measurement programs, etc.

At least one of the processor 223 and controller 221 will also preferably be operatively connected to an interactive user interface. Inputs may be provided through the use of the interface. In addition to conventional user commands to control repair operation, the inputs may be control programs, defect detection algorithms, or automatic programming systems. Suitable neural network, expert system, and statistical process control tools may generally be adapted and integrated within the processor or controller to analyze the sensor data used for monitoring and controlling the repair process. Advances in "knowledge engineering," further developments of embedded systems, and decreased hardware size and cost will provide for increasing automation. For instance, some benefits of neural networks are summarized as follows:

Reduced maintenance costs and minimized chances of catastrophic failures through early detection and trend analysis;
Significant reduction in data analysis tasks/time;
Solves difficult process problems that cannot be solved quickly or accurately with conventional methods; and
Robust, accurate and operate in real-time.

Pertinent applications include:
Performing computer-chip manufacturing quality control;
Predicting product quality;
Maintaining product quality specifications; and
Performing defect classifications.

Figure 3:
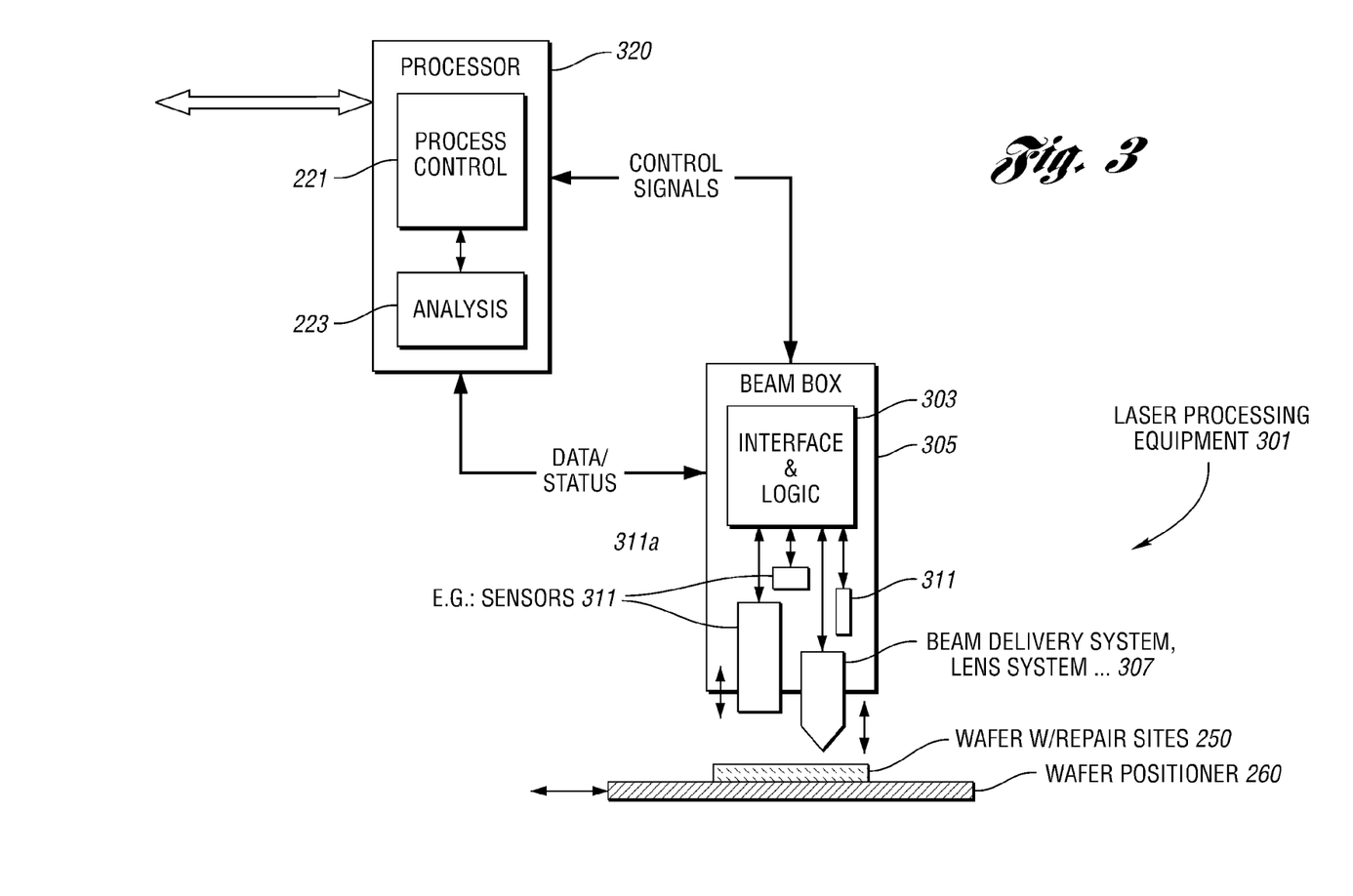
FIG. 3 is a schematic block diagram which shows some elements of one embodiment of the present invention.

FIG. 3 shows some elements of a specific embodiment of the present invention, specifically directed to laser-based memory repair. Laser processing equipment 301 includes at least a laser source and a beam delivery system.

A beam box 305 generally includes a suitable pulsed laser source (not shown), for instance q-switched, mode locked, or gain switched source(s).

The beam delivery system 307 delivers laser energy to predetermined repair sites on the wafer during three-dimensional motion of the workpiece 250 (e.g., a wafer having repair sites) relative to the beam box 305.

By way of example, the '268, '622, '899, '458 and '786 patents, and the '0880 publication are referenced for teachings of laser pulse generation, control of pulse characteristics, methods and systems for beam delivery, and general laser-repair system operation. By way of example, specific reference is made to FIGS. 2-10 and the corresponding text of the '473 patent for details of a system for precisely positioning a beam waist relative to a link in three-dimensions. In an application of memory repair, a preferred system for precision X-Y positioning is generally described in the '844 patent. Specific reference is made to FIG. 1-12 and the corresponding text therein.

The commercially available M455 memory repair system produced by the assignee of the present invention generally incorporates a pulsed laser system, beam delivery, and the beam positioning technology noted above. The system demonstrated capability of repair (blowing links) of state-of-the art memory devices having 1-1.5 micron link pitch. The dimensions of a link are typically finer than 1 micron in width and depth. The laser positioning relative to a link is specified as 0.15 microns at 3*sigma. A short pulse, frequency doubled NdYVO4 laser was used to process some links with a focused spot size of about 0.7 µm.

Laser repair equipment utilized with other repair system architectures may be used when practicing embodiments of the present invention.

Again referring to the embodiment of FIG. 3, sensing equipment will generally include one or more sensors 311 to detect a substrate condition. Sensing equipment used to detect substrate conditions is preferably integrated into the beam box 305. However, all or part of the sensing sub-system may be disjoint from the beam box 305 and configured as one or more separate sensor stations with communication to the processor 223 and the controller 221.

One or more sensors in the beam box 305 may share a common path with a laser. For example, measuring thickness variations of a layer or other material may be of interest for process control. One method and system for measurement of thickness and layer reflectivity is disclosed in FIGS. 11-13 and the corresponding text of the '268 patent. Precise control of the pulse energy delivered to a target structure is based on thickness measurement. The pulsed laser source and auxiliary laser diode shown therein share a common path. Other thickness measurement probes are also commercially available. Further, commercially available white light or laser-based interferometers may be used for measuring surface quality or defect detection. Atomic Force Microscopes (AFMs) and scanning electron microscopes (SEMs) are other tools which may be generally useful for monitoring the condition of the semiconductive substrate, although AFMs and SEMs are primarily suited for sampling. Although limited in resolution, other sensors are desirable for statistically significant sampling or 100% inspection.

In addition to semiconductive substrate monitoring with one or more sensors, at least one sensor 311*a* may be disposed within the beam box 305 for monitoring a condition of the laser processing equipment or sensing equipment. By way of example, the beam box may also include at least one photodetector for the monitoring of laser parameters, for instance position sensitive detectors. One or more such sensors may be used to monitor and/or measure average laser power, peak pulse power, pulse width, spot diameter, spot shape, spot centering, focus, and wavelength.

The '4192 publication teaches how one or more conditions of a laser processing machine may be monitored and controlled through the use of a graphical user interface. The workpiece may be viewed during a laser processing operation through the use of a graphical user interface (GUI). The principles may readily be adapted to monitor time series or other non-image data. Data from a processor 32 (as shown in the '4192 publication) may be transmitted as raw or processed data to a location or over the internet for remote diagnostics. Third party application programs may be integrated.

Preferably, data related to conditions or process variables of the substrate or the laser processing equipment will be displayed through a graphical user interface (GUI), and the data may be transmitted outside the semiconductor station (e.g., "in plant", outside the clean room) or to remote users via the internet. Further, such users may provide inputs or programs to the processor 223 or the controller 221.

Figure 4:
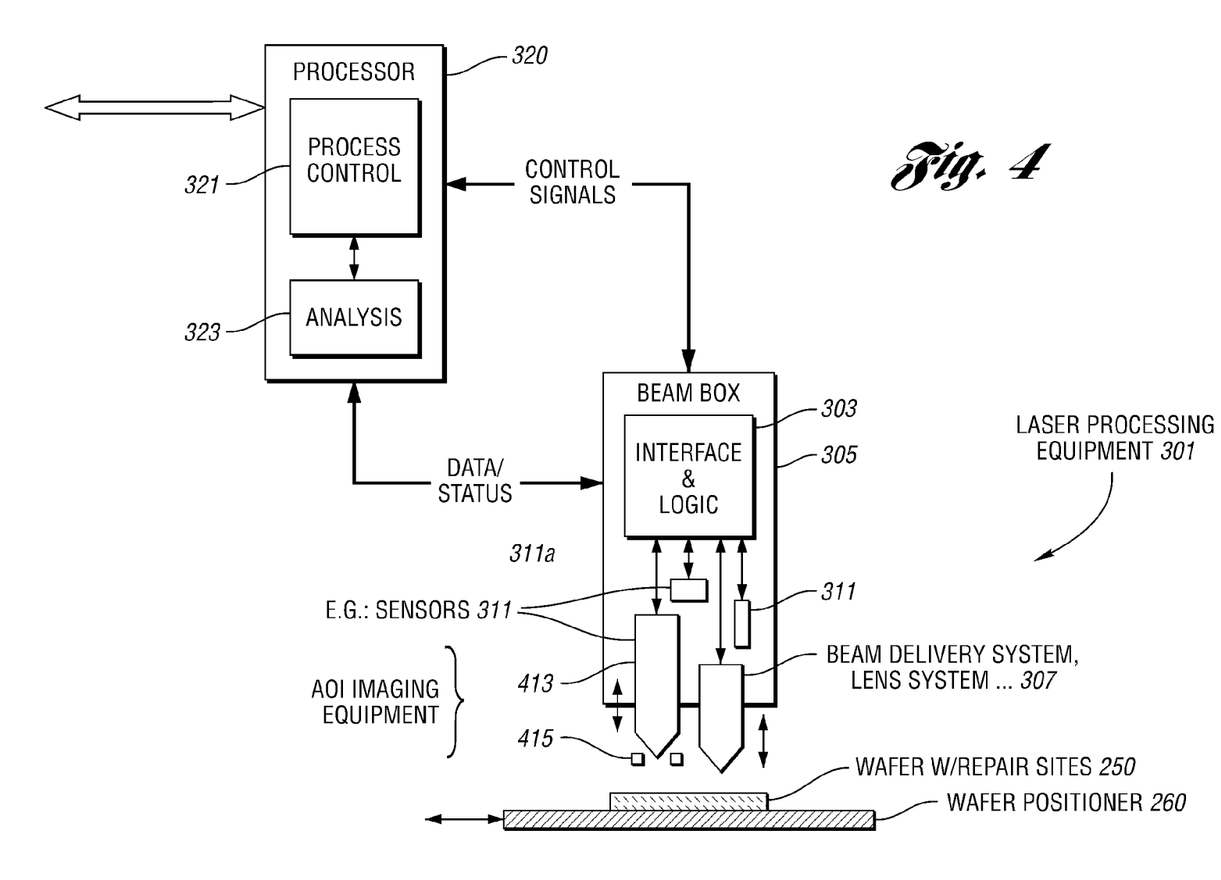
FIG. 4 is a schematic block diagram which shows a specific embodiment of the present invention directed to automatic optical inspection (AOI)

By way of example, FIG. 4 generally shows an inspection system, referred to as "automatic optical inspection" ("AOI"). In one embodiment the combination may include an "automatic optical inspection" (AOI) system or subsystem. The system may also be configured as "semi-automatic" with some level of operator intervention. Semi-automatic inspection is useful for providing much more information than available with infrequent manual checks, and for obtaining data which may be used to "train" a system for AOI.

In the exemplary embodiment of FIG. 4, the AOI sensor subsystem 413 (for instance a high resolution color imaging system) is to be used for automatic optical inspection. The subsystem includes a high resolution optical system and an electronic imager, such as a high resolution digital camera that produces and transmits digital imagery at video rates. Flexible illuminator 415 may be brightfield, darkfield, or any combination thereof. By way of example, the inspection lens may provide magnification of 25×-150× for imaging workpiece defects. The lens system may be arranged on a motorized turret for viewing defects at different scale, coarse magnification for defect detection, and fine magnification for detailed analysis. Focusing, selection of the magnification, and data analysis may be knowledge-based and guided by a controller 321.

In a preferred embodiment, processor 323 will execute algorithms for automatic recognition of substrate defects. Additionally, tracking and monitoring of laser repair system performance parameters is useful. Similarly, detection of defects of the substrate and low level image processing operations may be carried out with programs using an embedded processor within the beam box 305.

Such defects may, in some instances, be systematic (as opposed to random) defects caused by malfunction or drift of the laser repair equipment. Other defects may be random defects not detected in earlier test procedures, for example a defect not detected in electrical test. Numerous algorithms for detection of wafer defects have been developed over the years for sub-micron defects at the nanometer scale as exemplified by patents to KLA Tencor. By way of example, FIG. 1, from the '2299 publication, shows an example of an AOI system closely tied to electrical tests and associated defects (some which resulted from electrical test).

Optical inspection processing tools may include commercially available software tools, preferably with "learning" capability. In one of more embodiments, commercially available tools from Cognex Inc. (http://www.cognex.com/) or Halcon (http://www.mvtec.com/products/) may be used.

Exemplary and non-limiting applications of an AOI or semi-automatic system for improving the performance of laser-based memory repair machines include:

Obtaining images of links at various cut locations, and verifying correct links were cut;

Template matching or other pattern recognition algorithms to determine cut quality; and Interactive tools to initially allow operator to classify and quantify cut quality, and "machine learning" of the results for higher degree of machine recognition.

Figure 5:
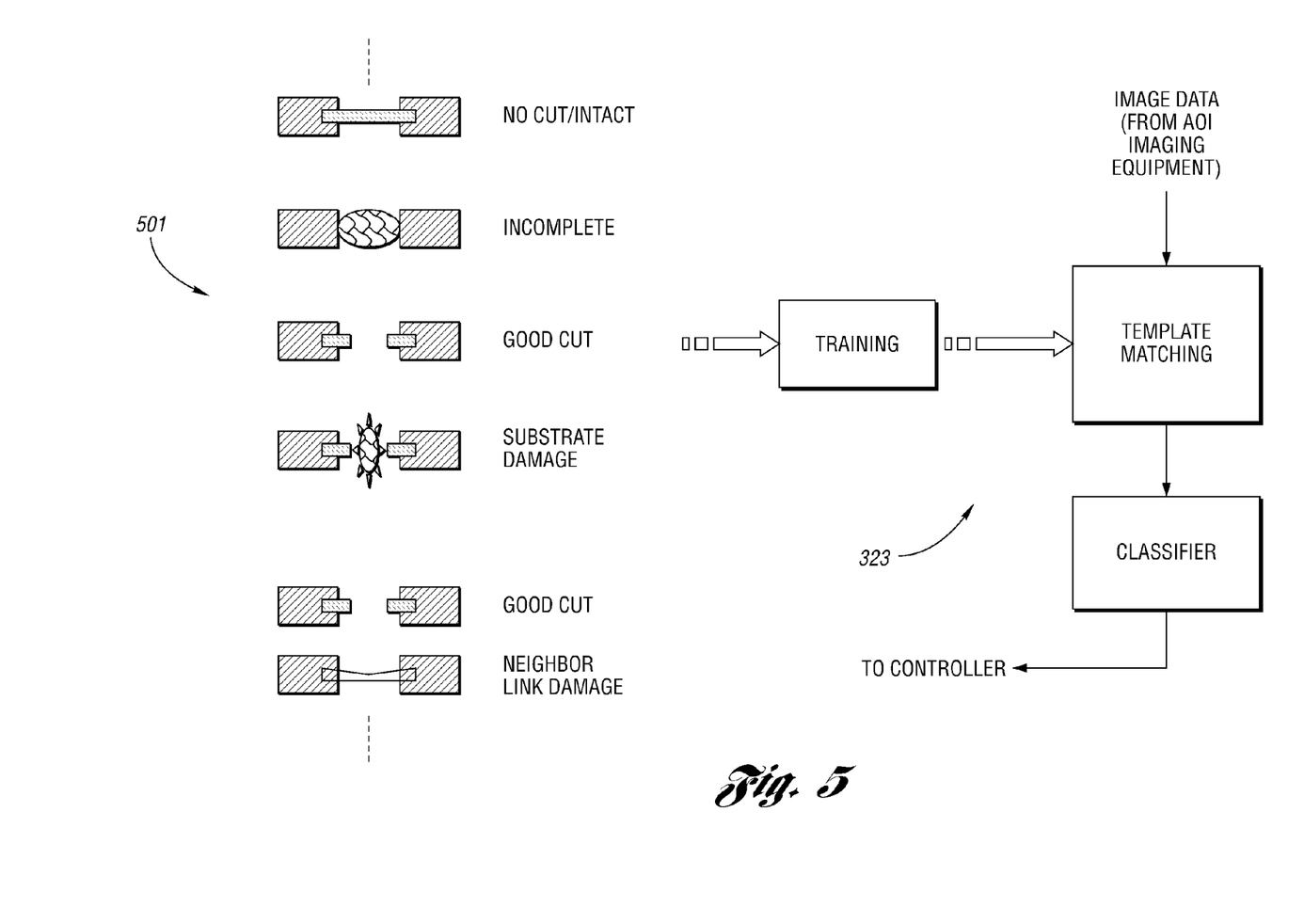
FIG. 5 is a schematic diagram, partially in block diagram form, which illustrates some of the most critical defects of memory repair.

FIG. 5 schematically illustrates some of the most critical defects of memory repair. The variations shown are representative of variations that are found in high magnification microscopic images of a link and surrounding area, for example grey scale variations. In one or more embodiments, sample defects are provided for training the inspection system. An available template matching tool may be used to match reference images 501 with image data obtained with the AOI system. A match score or other metric is used by the template matching algorithm to classify defects. The results may then utilized by the controller to initiate an action.

Preferably, for each field of view, a single grey scale image from one imaging device will be sufficient for discrimination of most defect types. However, multiple images acquired under various illumination conditions (with a flexible illuminator) and/or with multiple sensors may also be used to implement the pattern recognition algorithms.

With reference to FIG. 4, as an example, link pitch is approaching one micron, with fuse widths of 0.2-6. micron. Early detection of system disturbances prevent systematic errors that result in systematic and repeated errors, and resulting scrap. For example, automatic verification of laser-to-link alignment, or early detection of drift, can prevent marginal cut and a large number of device failures.

Also, in accordance with at least one embodiment of the present invention, the AOI system or semi-automatic system may be used as a tool to qualify link processing for new layouts, link structures, and materials. The qualifying process may include automatically adjusting at least one of a temporal and spatial characteristic of a laser pulse. Corresponding changes in process limits may be quantified and reported using image data from AOI imaging equipment and analysis within processor.

Chapter 19 of LIA HANDBOOK OF LASER MATERIALS PROCESSING, entitled "Link Cutting/Making," describes some operations which are typically performed manually to qualify a system. For example, at least one of an energy study and, vernier run, or other process qualification operations, are typically performed with link blowing systems. Obtaining test data may be tedious and time consuming.

For example, the following is a direct quotation from the LIA HANDBOOK: "Effective spot size changes with energy setting and may differ from the standard spot size ($1/e^2$). A vernier run reveals the effective spot size for a specific power setting by blasting a series of evenly spaced links with a laser step size slightly larger than the link pitch. This is illustrated in FIG. 11" (i.e., FIG. 6 herein). "The pitch difference times the number of links affected by the laser equals the sum of the spot size and link width. Because three of the four parameters are known, the effective spot size may be obtained."

Figure 8:
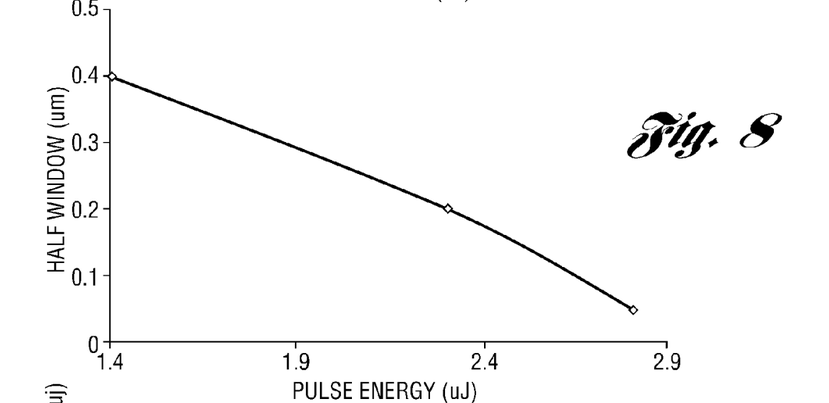
FIG. 8 is an exemplary graph of positioning accuracy half window (in microns) versus pulse energy (in micro-joules) which shows accuracy window with a 4 micron spot on copper links; this graph indicates the variation in maximum pulse energy that can be applied to the link as a function of spot position relative to the center of the link, without causing the optically observed damage; the half window here represents the maximum spot position deviation from the center of the link achieved at each laser pulse energy without observing optical damage.

By way of example, in a related application of link removal for laser trimming (adjustment of resistance) of a device, a vernier run was executed, Positioning accuracy test results shown in FIG. 8 were obtained by offsetting the center of the beam away from the center of the links (in this case copper and gold links arranged in a ladder network for laser adjustment of a circuit) and visually observing damage to each link. Each graph shows the observed damage energy threshold versus the position offset. Maximum energy values shown correspond to near-ideal, spot-to-link alignment. The energy process window accounts for processing system positioning errors and is generally less than the maximum energies shown in FIG. 8. A "through the lens" imaging system was used to acquire image data in the experiment.

In an embodiment of the present invention a similar operation may be carried out using a control program to precisely position a laser spot relative to link. An acousto-optic modulator or other suitable laser power controller (not shown) in beam delivery system 307 controls the energy delivered to a link. The link may then be inspected visually using AOI or semi-automatic tools to aid an operator. The steps may be repeated for any number of links so as to obtain some confidence level in the results.

Referring to FIG. 4, a control program may issue commands from processor 320 to carry out the operation. The commands will cause stage 260 to be automatically positioned so as to view links with an imaging system 413, separated from the processing laser in this case. The links may be viewed before and after processing in any suitable sequence.

In some embodiments the center of the link may be determined with respect to the laser spot center position with X, Y, Z accuracy of about 0.15 µm or better using estimation methods that provide for sub-pixel accuracy. A process control monitoring tool (SPC) may be configured to provide a report, a graph similar to FIG. 8, and a measure of the corresponding energy window.

In at least one embodiment of the present invention the AOI or semi-automatic tool may be used on-site, or operated from a remote location through the use of a GUI, to carry out or assist in link and laser spot measurement and energy window calculations.

Hence, the optical inspection processing tools, preferably with "learning" capability (as disclosed above) may be used to automate or provide significant ease of use for the vernier runs. The system may utilize a through the lens illumination/viewing configuration, a separate imaging system as shown in FIG. 4, or a combination. The overall value of at least semi-automated operation will further increase with smaller spot sizes and finer link pitch wherein the depth of focus is very shallow and positioning tolerances are very stringent (e.g., 16 fold reduction in depth of focus when spot size is reduced from 4 µm to 1 µm, and sub-micron spots may be used for link processing).

Another frequently used qualification option is the energy run; the measurement of the process energy window. The energy window will generally vary as a function of various laser characteristics.

Figure 7:
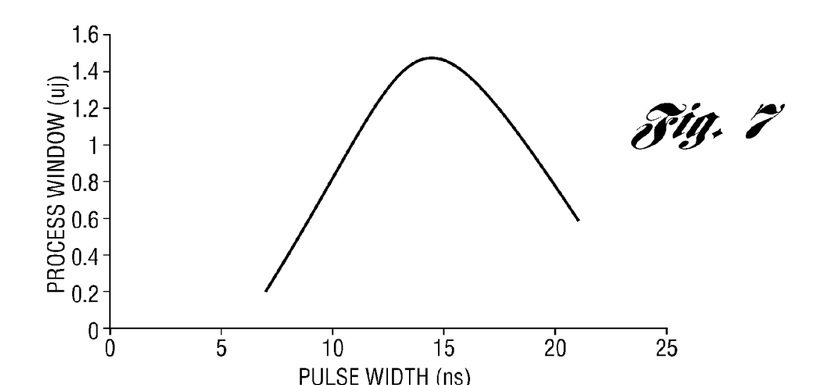
FIG. 7 is an exemplary graph of energy process window (in micro-joules) versus pulse width which shows the dependence of the energy process window on laser pulse width for copper links; the energy process window (in micro-joules) here is the range of the laser pulse energies between the minimum energy needed for severing the links and the maximum energy at which a dark spot is observed under the links.
Figure 9:
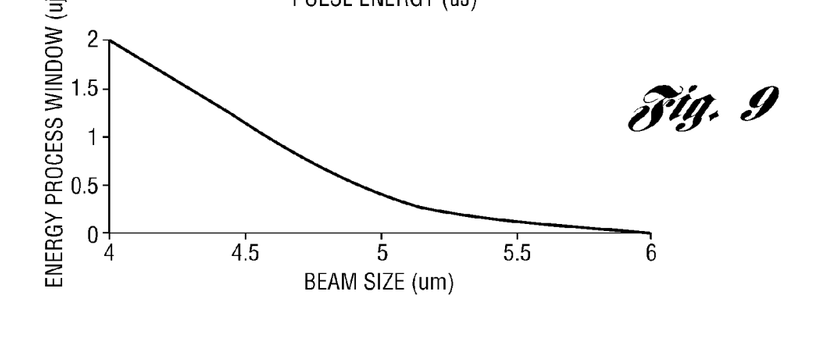
FIG. 9 is an exemplary graph of energy process window (in micro-joules) versus beam size (in microns) which shows the process window as a function of spot size on copper links; the energy process window (in micro-joules) here is the range of the laser pulse energies between the minimum energy needed for severing the links and the maximum energy at which a dark spot is observed under the links.

By way of example, FIGS. 7 and 9 show the energy window as a function of the pulse width and spot diameter, respectively, wherein each parameter was varied separately. In a preferred system of the present invention both the spot size and pulse width may be controlled by a control program. The U.S. patents and publications incorporated by reference herein generally disclose exemplary methods and system for varying at least one of the laser spot size, spot distribution, pulse width, pulse shape, energy, polarization, and other spatial or temporal characteristics. Specific reference is made to at least '268, '844, '458, '473 patents for further information.

Figure 6:
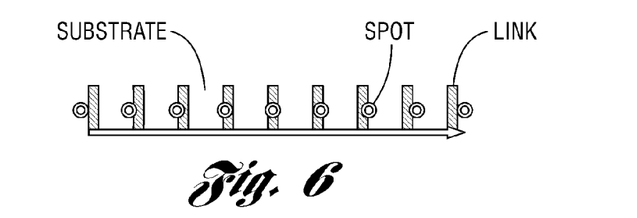
FIG. 6, adapted from the LIA HANDBOOK OF LASER MATERIALS PROCESSING, illustrates the steps of a "vernier run" to determine an effective spot size for processing an exemplary wafer.

The upper and low process limits can be determined and quantified when links of FIG. 6 are irradiated with increasing energy, (preferably, after each link is irradiated with a pulse having energy monitored by at least one of the sensors 311). AOI and analysis 323 may be used to detect a change in the link and surrounding material (examining for defects similar to those in FIG. 5).

If desired, surface profilometers (SEM or AFM) may then be used to provide topographical maps of the structures with resolution in the nanometer range.

In a preferred embodiment, a system of FIGS. 3-5 will include all features for process qualification. However, a separate off-line system may be used to perform certain operations, and the off-line system may be remotely located. The information obtained from such an off-line system may be communicated to the processor 320 through the interface and utilized to affect processing of a wafer.

Alternately 3D optical profilometers such as the Micro Photonics Zoomsurf 3D (http://www.microphotonics.com/ZoomSurf3D.htm) or the Zygo View 6000 Series Optical Profiling System (http://www.lambdaphoto.co.uk/productsl140.110) may provide adequate resolution for analysis in the memory repair system while not requiring contact or special environments and providing. The later system has its own automated 3D metrology software for analysis and feedback to the system. Other optical non-contact systems may also evolve for a suitable in-system solution.

The systems of FIGS. 3-5 may be configured to measure alignment targets, position a laser beam relative to links, verify the alignment, adjust any number of laser characteristics, obtain data, analyze and report the data. A suitable combination of manual, semi-automatic, and automatic operations may be utilized.

Those skilled in the art will recognize that various combinations of the exemplary embodiments herein may be utilized without departing from the scope of the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A control system for adaptively controlling a laser-based material processing process, the system comprising:
   sensing equipment to measure a process variable or condition of at least one of a laser-based material process system and a workpiece processed by the material processing system and to provide a corresponding measurement signal; and
   a signal processor for processing the measurement signal to obtain a processed signal which initiates, at least semi-automatically, an action associated with at least one of the material processing system and the workpiece.

2. The control system as claimed in claim 1, wherein the control system is a human-in-the-loop system and wherein the processed signal semi-automatically initiates the action.

3. The control system as claimed in claim 1, wherein the workpiece includes a semiconductive substrate and wherein the sensing equipment senses at least one defect of the substrate.

4. The control system as claimed in claim 1, wherein the sensing equipment includes optical sensing equipment.

5. The control system as claimed in claim 1, wherein the action controls laser pulse energy delivered to a target structure on the workpiece.

6. The control system as claimed in claim 1, wherein the material processing system delivers at least one focused laser pulse to the workpiece and the sensing equipment measures at least one of average laser power, peak pulse power, pulse width, spot diameter, spot shape, spot centering, focus and wavelength.

7. The control system as claimed in claim 1, wherein the action directs or otherwise affects laser repair operations.

8. The control system as claimed in claim 1, wherein the sensing equipment includes an imager for imaging the workpiece at a plurality of different magnifications and wherein the sensing equipment measures a condition of the workpiece at each of the plurality of different magnifications to provide corresponding measurement signals.

9. The control system as claimed in claim 1, wherein the material processing system is a laser-based memory repair system, wherein the workpiece includes links to be cut by the system and wherein the sensing equipment obtains images of the cut links at various locations and wherein the signal processor processes the images to perform at least one of the following: verify that correct links were cut, determine cut quality and allow an operator of the repair system to classify and quantify cut quality.

10. The control system as claimed in claim 1, wherein the sensing equipment includes an AOI subsystem to obtain image data and wherein the control system further comprises means for receiving reference image data and means for comparing the reference image data with the image data obtained with the AOI subsystem to classify defects of the workpiece.

11. The control system as claimed in claim 1, wherein the action is automatic adjustment of at least one of a temporal characteristic and a spatial characteristic of a laser pulse generated by the material processing system.

12. The control system as claimed in claim 1 further comprising a user interface for receiving a human operator-generated input and a processor for processing the input wherein the processed input and the measurement signal are processed to obtain the processed signal to thereby semi-automatically initiate the action.

13. The control system as claimed in claim 1 further comprising means for receiving a machine-generated input and a processor for processing the input wherein the processed input and the measurement signal are processed to obtain the processed signal to thereby automatically initiate the action.

14. The control system as claimed in claim 1, wherein the signal processor processes the measurement signal to obtain data and wherein the control system includes a pattern recognition subsystem which receives the data.

15. The control system as claimed in claim 14, wherein the pattern recognition subsystem is trainable and includes a neural network.

16. The control system as claimed in claim 1, wherein the sensing equipment includes a vision subsystem for measuring laser-to-link alignment to detect a systematic alignment error or change in the alignment and wherein the action includes halting laser material processing if the error or change exceeds a predetermined value.

17. The control system as claimed in claim 16, wherein the action includes execution of a diagnostic program to detect the source of the alignment error or change.

18. A system for at least semi-automatically qualifying a laser-based material processing system which delivers laser energy to locations on or adjacent a plurality of microstructures formed on a workpiece to at least partially process the microstructures, the qualifying system comprising:
  sensing equipment to measure a process variable or condition of at least one of the material processing system and the at least partially processed microstructures and areas of the workpiece adjacent the at least partially processed microstructures and to provide corresponding measurement signals; and
  a signal processor for processing the measurement signals to obtain a processed signal which qualifies, at least semi-automatically, the material processing system.

19. The qualifying system as claimed in claim 18, wherein the material processing system comprises a laser-based link cutting system and wherein the microstructures include a plurality of links having a pitch.

20. The qualifying system as claimed in claim 18, wherein the workpiece is a test workpiece.

21. The qualifying system as claimed in claim 18, wherein the sensing equipment includes optical sensing equipment.

22. The qualifying system as claimed in claim 18, wherein the sensing equipment includes an AOI subsystem to obtain image data.

23. The qualifying system as claimed in claim 18, wherein the laser energy is delivered in the form of laser pulses and wherein the processed signal initiates, at least semi-automatically, adjusting at least one of temporal and spacial characteristic of the laser pulses.

24. The qualifying system as claimed in claim 18, wherein the laser energy is delivered in the form of focused laser pulses and wherein the processed signal initiates, at least semi-automatically, adjusting at least one of average laser power, peak pulse power, pulse width, spot-diameter, spot shape, spot centering, focus and wavelength.

25. The qualifying system as claimed in claim 18 further comprising:
  a user interface for receiving a human operator-generated input; and
  a processor for processing the input wherein the processed input and the measurement signals are processed to obtain the processed signal to thereby semi-automatically initiate qualification of the material processing system.

26. The qualifying system as claimed in claim 18 further comprising:
  means for receiving a machine-generated input; and
  a processor for processing the input wherein the processed input and the measurement signals are processed to obtain the processed signal to thereby automatically initiate qualification of the material processing system.

27. The qualifying system as claimed in claim 18, wherein the qualifying system is a human operator-in-the-loop system and wherein the processed signal semi-automatically initiates qualification of the material processing system.

* * * * *